US011907812B2

(12) United States Patent
Yang et al.

(10) Patent No.: US 11,907,812 B2
(45) Date of Patent: Feb. 20, 2024

(54) APPARATUS FOR DETERMINING 3-DIMENSIONAL ATOMIC LEVEL STRUCTURE AND METHOD THEREOF

(71) Applicant: KOREA ADVANCED INSTITUTE OF SCIENCE AND TECHNOLOGY, Daejeon (KR)

(72) Inventors: Yongsoo Yang, Daejeon (KR); Juhyeok Lee, Daejeon (KR); Chaehwa Jeong, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 724 days.

(21) Appl. No.: 17/132,762

(22) Filed: Dec. 23, 2020

(65) Prior Publication Data
US 2022/0188696 A1    Jun. 16, 2022

(30) Foreign Application Priority Data

Dec. 16, 2020 (KR) .................... 10-2020-0176633

(51) Int. Cl.
*G06N 20/00* (2019.01)
*G06N 3/04* (2023.01)
(Continued)

(52) U.S. Cl.
CPC ............. *G06N 20/00* (2019.01); *G01N 23/04* (2013.01); *G01N 24/087* (2013.01); *G06N 3/04* (2013.01);
(Continued)

(58) Field of Classification Search
CPC ..... G01N 2223/646; G01N 2223/6462; G01N 2223/401; G01N 2223/102; G01N 23/04;
(Continued)

(56) References Cited

U.S. PATENT DOCUMENTS 10,727,025 B2    7/2020 Lee et al.
2008/0240548 A1*  10/2008 Yeoh ............... H01J 37/222
                                                    382/154
(Continued)

FOREIGN PATENT DOCUMENTS

KR    101969242 B1    4/2019

*Primary Examiner* — Irakli Kiknadze
(74) *Attorney, Agent, or Firm* — Bridgeway IP Law Group, PLLC; Jihun Kim

(57) ABSTRACT

A data generating method includes: an atomic model generating step of generating one or more three-dimensional atomic models corresponding to a nanomaterial to be measured; a three-dimensional data generating step of generating three-dimensional atomic level structure volume data corresponding to the nanomaterial to be measured based on the one or more three-dimensional atomic model; a tilt series generating step of generating a tilt series by simulating three-dimensional tomography for a plurality of different angles in a predetermined angle range for at least some of the three-dimensional atomic level structure volume data; and a three-dimensional atomic structure tomogram volume data generating step of generating a three-dimensional atomic structure tomogram volume data set by performing three-dimensional reconstruction on at least some of the three-dimensional atomic level structure volume data based on the tilt series.

22 Claims, 10 Drawing Sheets

(51) Int. Cl.
*H01J 37/26* (2006.01)
*G01N 23/04* (2018.01)
*G01N 24/08* (2006.01)

(52) U.S. Cl.
CPC ........ *H01J 37/26* (2013.01); *G01N 2223/646* (2013.01)

(58) Field of Classification Search
CPC ............... G01N 24/087; G01N 23/046; G01N 2223/615; G06T 17/20; G06T 7/73; G06T 2207/20081; G06T 11/60; G06T 11/001; G06T 15/005; G06T 15/55; G06T 1/20; G06T 15/205; G06T 15/506; G06T 15/60; G06T 2215/12; G06T 2200/28; G06T 2200/04; G06T 17/00; G06T 7/136; G06T 7/0002; G06T 5/002; G06T 2207/10081; G06T 11/006; G06T 7/50; G06T 7/0006; G06T 7/12; G06T 2207/20168; G06T 2207/30164; G06T 2200/08; G06F 17/10; G06F 30/00; G06N 3/08; G06N 3/045; G06N 20/00; G06N 3/04; G06N 3/082; G06N 3/0454; B82Y 35/00; H01J 37/26; H01J 37/28; H01J 37/222; H01J 2237/226; H01J 2237/2611; G06V 10/98; G06V 10/46; G06V 20/64; Y10S 128/922
USPC ....................................................... 378/4, 21
See application file for complete search history.

(56) References Cited

U.S. PATENT DOCUMENTS

2016/0171727 A1\* 6/2016 Bouchard ............... G06T 5/002
   382/131
2020/0003682 A1\* 1/2020 Frenkel ................ G01N 23/083

\* cited by examiner

APPARATUS FOR DETERMINING 3-DIMENSIONAL ATOMIC LEVEL STRUCTURE AND METHOD THEREOF

STATEMENT REGARDING PRIOR DISCLOSURES BY THE INVENTORS

The inventors of the present application are the authors of publication, "Single-atom level determination of 3-dimensional surface atomic structure via neural network-assisted atomic electron tomography," published on Aug. 20, 2020, one year or less before the effective filing date of the present application, which is not prior art under 35 USC 102(b)(1)(A).

BACKGROUND OF THE INVENTION

Field of the Invention

The present disclosure relates to an apparatus for determining a three-dimensional atomic level structure of nanomaterials and a method thereof, and more specifically, to a data generating apparatus and a data generating method, and an apparatus for determining a three-dimensional atomic level structure and a method for determining the same, which generate three-dimensional atomic level volume data for training of a deep learning filter on an area where data is insufficient in the atomic level structure of nanomaterials and improve accuracy and reliability of the three-dimensional atomic level structure of nanomaterials using the deep learning filter trained from the data.

Description of the Related Art

In recent years, nanomaterial technology that handles the entire nanoscale area, which is the basis of materials, has been widely applied throughout electrical, chemical, optical, and bio industries since nanomaterials often exhibit epoch-making physical and chemical properties and high utility that are completely different from the corresponding bulk materials, and has been used as a major tool for developing high-performance, high-quality products.

The functional properties of nanomaterials are particularly highly dependent on a surface atomic structure, and are very different from the bulk structure by exhibiting surface reconstruction and relaxation. Therefore, accurate identification of the three-dimensional surface atomic structure at the individual atomic level has been a major concern in a wide range of industries utilizing physics, material science, chemistry, and nanoscience. For example, in the case of metal nanoparticles, the surface structure plays an important role in catalysis, and currently has important technological importance in synthesis of chemical substances, reduction of air pollution, fuel cell application, and the like. It is very important to thoroughly understand surface atoms in order to fine-tune the catalyst properties for each application.

Conventionally, the method for confirming the surface properties of the atomic scale has been limited to two-dimensional measurement such as, for example, scanning transmission electron microscopy (STEM), and even the newly attempted three-dimensional measurement method does not reach full resolution of a three-dimensional atomic scale. The conventional technology still has a problem in that it is difficult to determine a single atomic level structure or defects on a three-dimensional nanomaterial surface.

A deep learning-based neural network model has received considerable interest in its application in the field of electron microscopy. Technologies that use deep learning-based neural network models to recover lost data and improve ultra-high-resolution imaging have emerged in electron microscopy measurements. However, such applications have mainly been limited to fields of analyzing two-dimensional electron microscope images to recover some lost information or to improve image resolution.

In recent years, in order to solve these problems, technologies for measuring atomic-scale defects, that is, three-dimensional defects at individual atomic levels, three-dimensional strain, chemical order/disorder, and nucleation dynamics using electron-unit tomography techniques such as atomic electron tomography (AET) have been actively used in the field of nanomaterial technology. However, due to the fundamental technical geometric limitations in the process of inserting a specimen into the microscope during such tomography, it is impossible to experimentally measure a part of the entire tomography angle range, for example, the angle range out of the range of −65° to +65°, which causes a so-called "missing wedge" problem. The missing wedge causes elongation and Fourier ringing artifacts depending on the direction of the lost information. The missing wedge defects adversely affect the accuracy of determining a surface atomic structure, and these defects make it difficult to define the surface of nanomaterials and determine their true atomic positions, and therefore have been a major obstacle to precise measurement of three-dimensional surface atomic structures. When it is difficult to identify or determine the three-dimensional surface atomic structure with high precision, there are many problems in controlling the properties of nanomaterials or utilizing nanomaterials in actual mass production.

SUMMARY OF THE INVENTION

The present disclosure is proposed to solve the above problems, and an object of the present disclosure is to provide a data generating apparatus and a data generating method capable of improving performance of a deep learning filter used to determine a three-dimensional surface atomic structure of nanomaterials by generating a three-dimensional atomic model based on a principle of atomicity for nanomaterials and generating, based on the atomic model and a three-dimensional construction algorithm, reliable three-dimensional atomic structure data for learning for areas where it is difficult to acquire data in an atomic-scale electron microscope due to geometric measurement limiting factors (missing wedge defects, etc.) or various atomic level defects in nanomaterials, noise, strain, and the like.

In addition, an object of the present disclosure is to provide an apparatus for determining a three-dimensional atomic level structure of nanomaterials and a method for determining the same with improved accuracy and reliability in identifying or determining a three-dimensional surface atomic structure of nanomaterials by training a deep learning filter by generating data on an area that is conventionally insufficient in measuring a three-dimensional structure of a nanomaterial atomic scale through a three-dimensional atomic model generated based on a principle of atomicity and correcting tomograms that three-dimensionally reconstructs electron microscope image information at various angles using the deep learning filter.

In order to achieve the above object, a data generating apparatus according to an embodiment of the present disclosure includes:

an atomic model generator that generates one or more three-dimensional atomic models corresponding to a nanomaterial to be measured;

a three-dimensional data generator that generates three-dimensional atomic level structure volume data corresponding to the nanomaterial to be measured based on the one or more three-dimensional atomic model;

a tilt series generator that generates a tilt series by simulating three-dimensional tomography for a plurality of different angles in a predetermined angle range for at least some of the three-dimensional atomic level structure volume data; and a three-dimensional tomogram volume data generator that generates a three-dimensional atomic structure tomogram volume data set by performing three-dimensional reconstruction on at least some of the three-dimensional atomic level structure volume data based on the tilt series.

The atomic model generator may generate a three-dimensional atomic model based on a theoretical crystal structure of the nanomaterial to be measured and a three-dimensional atomic model based on an amorphous structure.

The atomic model generator may perform at least one of actualization correction processes including random atomic defect provision, random rotation or movement of the model structure, spatial change, and atomic density change on the one or more three-dimensional atomic models.

The three-dimensional data generator may generate the three-dimensional atomic level structure volume data by deriving a three-dimensional volume of atomic potential based on the one or more three-dimensional models and acquiring a result of convolution of a Gaussian distribution having the atomic potential and a predetermined standard deviation at each atomic position.

The tilt series generator may generate the tilt series by acquiring a linear projection from a three-dimensional atomic potential volume at a plurality of different tilt angles within the predetermined angle range for at least some of the three-dimensional atomic level structure volume data.

The three-dimensional atomic structure tomogram volume data generator may three-dimensionally reconstruct on the tilt series using a predetermined algorithm, and select axis convention during the three-dimensional reconstruction so that at least one of an x-direction axis, a y-direction axis, and a z-direction axis is parallel to a missing wedge direction.

In order to achieve the above object, a data generating method according to another embodiment of the present disclosure includes:

an atomic model generating step of generating one or more three-dimensional atomic models corresponding to a nanomaterial to be measured;

a three-dimensional data generating step of generating three-dimensional atomic level structure volume data corresponding to the nanomaterial to be measured based on the one or more three-dimensional atomic model;

a tilt series generating step of generating a tilt series by simulating three-dimensional tomography for a plurality of different angles in a predetermined angle range for at least some of the three-dimensional atomic level structure volume data; and a three-dimensional tomogram volume data generating step of generating a three-dimensional atomic structure tomogram volume data set by performing three-dimensional reconstruction on at least some of the three-dimensional atomic level structure volume data based on the tilt series.

In order to achieve the above object, an apparatus for determining a three-dimensional atomic level structure of a nanomaterial according to another embodiment of the present disclosure may include:

an atomic model generator that generates one or more three-dimensional atomic models corresponding to a nanomaterial to be measured;

a three-dimensional learning data generator that generates three-dimensional atomic structure tomogram volume data corresponding to the nanomaterial to be measured as three-dimensional learning data by simulating and reconstructing three-dimensional tomography based on the one or more three-dimensional atomic model;

a deep learning filter generator/learner that generates a deep learning filter by training a machine learning model using the three-dimensional learning data; and a three-dimensional atomic level structure determiner that generates second three-dimensional atomic structure tomogram volume data, in which an atomic arrangement region with insufficient data is corrected, by filtering first three-dimensional atomic structure tomogram volume data acquired through electron microscopy measurement of the nanomaterial to be measured with the deep learning filter, and determines a three-dimensional atomic level nanostructure of the nanomaterial to be measured based on the second three-dimensional atomic structure tomogram volume data.

The three-dimensional learning data generator may include:

A three-dimensional data generator that generates three-dimensional atomic level structure volume data corresponding to the nanomaterial to be measured based on the one or more three-dimensional atomic model;

a tilt series generator that generates a tilt series by simulating three-dimensional tomography for a plurality of different angles in a predetermined angle range for at least some of the three-dimensional atomic level structure volume data; and a three-dimensional atomic structure tomogram volume data generator that generates a three-dimensional atomic structure tomogram volume data set by performing three-dimensional reconstruction on at least some of the three-dimensional atomic level structure volume data based on the tilt series, in which the reconstructed three-dimensional atomic structure tomogram volume data set may form a three-dimensional learning data set for the training of the deep learning filter.

The three-dimensional data generator may generate the three-dimensional atomic level structure volume data by deriving a three-dimensional volume of atomic potential based on the one or more three-dimensional models and acquiring a result of convolution of a Gaussian distribution having the atomic potential and a predetermined standard deviation at each atomic position.

The three-dimensional data generator may generate, as a three-dimensional target data set, three-dimensional atomic level structure volume data acquired by deriving the three-dimensional volume of the atomic potential based on the one or more three-dimensional models and positioning a Gaussian distribution having a standard deviation equal to or different from the predetermined standard deviation at each atomic position in the three-dimensional volume.

The deep learning filter generator/learner may calculate an error by comparing a result output from the deep learning filter through forward-propagation based on the three-dimensional learning input data set with the three-dimensional target data set, and update hyperparameters of the deep learning filter in a manner, in which the error is reduced, by calculating (back-propagation) a gradient of the error in a reverse direction (from an output layer to an input layer) based on the error. By repeating this process, the deep learning filter can be trained and the parameters of the filter can be optimized to determine the three-dimensional atomic level structure.

In order to achieve the above object, a method for determining a three-dimensional atomic level structure according to another embodiment of the present disclosure may include:

an atomic model generating step of generating one or more three-dimensional atomic models corresponding to a nanomaterial to be measured;

a three-dimensional learning data generating step of generating three-dimensional atomic structure tomogram volume data corresponding to the nanomaterial to be measured as three-dimensional learning data by simulating and reconstructing three-dimensional tomography based on the one or more three-dimensional atomic model;

a deep learning filter generating/learning step of generating a deep learning filter by training a machine learning model using the three-dimensional learning data; and a three-dimensional atomic level structure determining step of generating second three-dimensional atomic structure tomogram volume data, in which an atomic arrangement region with insufficient data is corrected, by filtering first three-dimensional atomic structure tomogram volume data acquired through electron microscopy measurement of the nanomaterial to be measured with the deep learning filter, and determining a three-dimensional atomic level nanostructure of the nanomaterial to be measured based on the second three-dimensional atomic structure tomogram volume data.

DETAILED DESCRIPTION OF THE PREFERRED EMBODIMENTS

Figure 1:
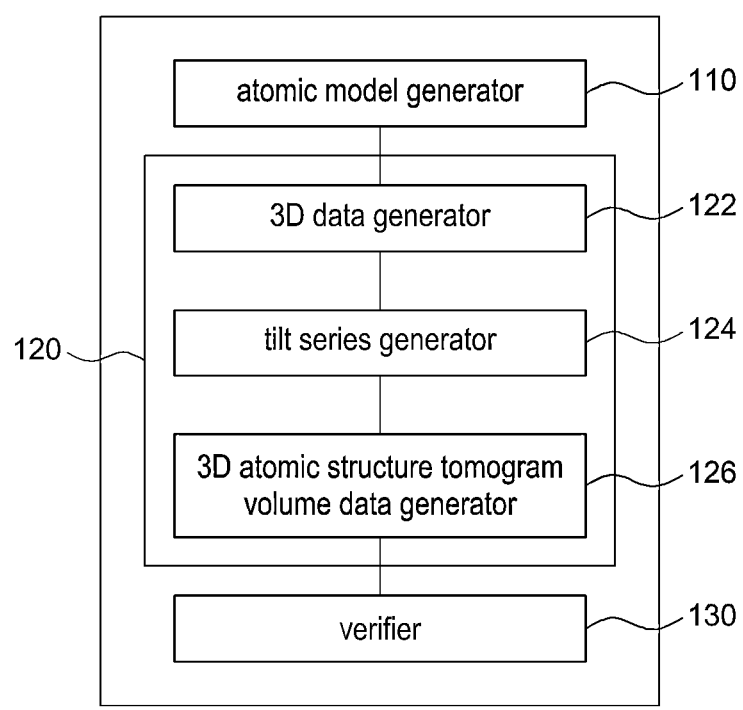
FIG. 1 is a schematic block diagram illustrating a schematic configuration of a data generating apparatus for learning data of a deep learning filter according to an embodiment of the present disclosure.

Hereinafter, the present disclosure will be described with reference to the accompanying drawings. However, the present disclosure may be implemented in various different forms, and is not limited to exemplary embodiments described herein. In addition, in the drawings, portions unrelated to the description will be omitted to obviously describe the present disclosure, and similar reference numerals are attached to similar portions throughout the specification.

Throughout the present specification, when any one part is referred to as being "connected (joined, contacted, and coupled) to" another part, it means that any one part and another part are "directly connected to" each other or are "indirectly connected to" each other with the other part interposed therebetween. In addition, unless explicitly described to the contrary, "including" any component will be understood to imply the inclusion of other components rather than the exclusion of other components.

The terms used in the present specification are only used to describe specific embodiments, and are not intended to limit the present disclosure. Singular forms are intended to include plural forms unless the context clearly indicates otherwise. It should be further understood that terms "include" or "have" used in the present specification specify the presence of features, numerals, steps, operations, components, parts mentioned in the present specification, or combinations thereof, but do not preclude the presence or addition of one or more other features, numerals, steps, operations, components, parts, or combinations thereof.

Hereinafter, preferred embodiments will be provided in order to assist the understanding of the present disclosure. However, it will be obvious to those skilled in the art that the preferred embodiments is only an example of the present disclosure and may be variously modified and altered without departing from the scope and spirit of the present disclosure. In addition, these modifications and alterations will fall within the following claims.

The inventors of the present disclosure have recognized that measurable angles are limited due to geometric limitations when the existing electron microscope used to measure an atomic level structure of nanomaterials measures actual specimens, and that a problem arises in a determination of an accurate three-dimensional atomic level structure of nanomaterials, particularly a three-dimensional surface atomic structure having a great influence on properties of the nanomaterials, due to missing wedge, insufficient projection data, various noises, and the like which are caused by unacceptable or insufficient data for areas other than the measurable angle range. Therefore, the inventors provide a data generating apparatus and a data generating method that generates or amplifies highly reliable data on a lost three-dimensional atomic level structure area stably and in large quantities based on "atomicity" which is the previously confirmed scientific law that all substances are composed of atoms. In addition, it is intended to provide an apparatus and method for determining three-dimensional surface atomic level structure of nanomaterial with high reliability and robustness despite defects, instability, or the like due to various external or internal factors as well as missing wedge by using the sufficient amount of generated high-reliability data for the generation and training of the deep learning filter.

Hereinafter, in the present specification, the "three-dimensional atomic level structure" of nanomaterials refers to an arrangement structure of three-dimensional atoms of nanomaterials, and the "three-dimensional surface atomic level structure" refers to a three-dimensional arrangement of atoms on the surface of the nanomaterial. The "three-dimensional tomogram volume data" refers to volume data derived from tomogram of a nano electron microscope, such as three-dimensional atomic structure tomogram volume data, and may include defects accompanied in the electron microscope measurement. In addition, the fact that the three-dimensional atomic structure tomogram or related data has been corrected means that some or all of defects and elements in change caused by various external environmental factors or internal factors that may occur in the corresponding nanomaterial are reflected in the structure or data.

Hereinafter, the present disclosure will be described in more detail with reference to the accompanying drawings illustrating an embodiment of the present disclosure.

FIG. 1 is a schematic block diagram illustrating a schematic configuration of a data generating apparatus for learning data of a deep learning filter according to an embodiment of the present disclosure.

Referring to FIG. 1, a data generating apparatus 100 according to an embodiment of the present disclosure may include an atomic model generator 110, a three-dimensional learning data generator 120, and a verifier 130. In another embodiment of the present disclosure, the verifier 130 may not be included inside the data generating apparatus but may be included outside the data generating apparatus.

The atomic model generator 110 may generate one or more three-dimensional atomic models corresponding to the nanomaterial to be measured. The one or more three-dimensional atomic model may be a three-dimensional atomic model based on a theoretical crystal structure of nanomaterials to be measured and/or a three-dimensional atomic model based on an amorphous structure.

Figure 2:
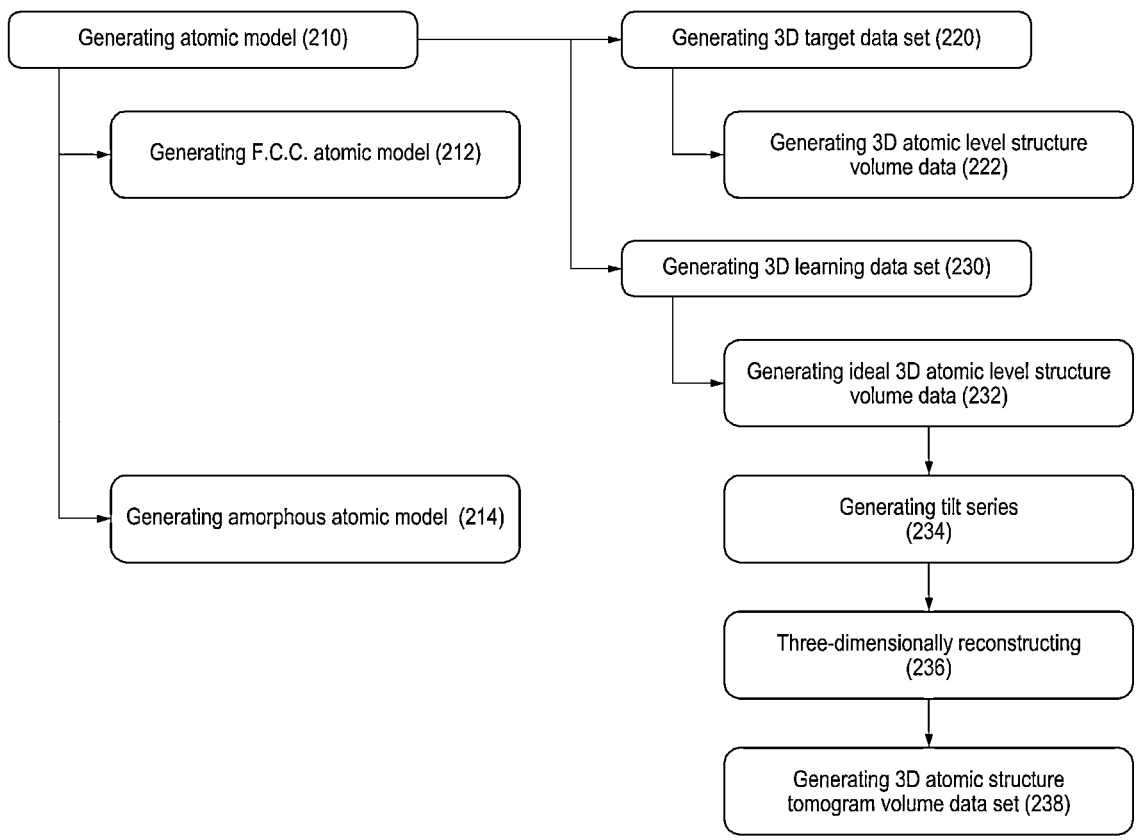
FIG. 2 is a conceptual diagram illustrating atomic model generation and three-dimensional atomic level structure volume data generation when a nanomaterial to be measured is a Pt nanoparticle according to an embodiment of the present disclosure.

FIG. 2 is a schematic diagram of atomic model generation and three-dimensional(3D) atomic level structure volume data generation when the nanomaterial to be measured is a Pt nanoparticle according to an embodiment of the present disclosure. In FIG. 2, the atomic model generator generates an atomic model (hereinafter, "face centered cubic lattice (F.C.C.) atomic model") 212 corresponding to the face centered cubic lattice (F.C.C.) structure which is a theoretical crystal structure of Pt nanoparticles and/or an atomic model (hereinafter, "amorphous atomic model") 214 corresponding to an amorphous structure.

In addition, the one or more three-dimensional atomic models may include three or more atomic models. For example, two or more atomic models may be generated by assigning different B factor values based on the theoretical crystal structure of nanomaterials to be measured or the amorphous structure and may be used for data generation.

When generating the one or more three-dimensional atomic models, processing considering at least one of actualization correction processes including random atomic defect provision, random rotation or movement of the model structure, spatial change, atomic density change, and random shape cropping may be performed in the three-dimensional atomic level arrangement structure of each atomic model.

For example, if the nanomaterial to be measured according to the embodiment of the present disclosure is Pt nanoparticle, the F.C.C. atomic model may reflect random atomic defects similar to the atomic defect ratio of the atomic level arrangement structure of conventional nanoparticles, or may randomly rotate and/or move the structure of the generated atomic model. In addition, it is also possible to give the generated atomic model the spatial change of a ratio (e.g., 22 pm) predetermined by comparing to the ideal F.C.C. structure position for each atomic position. In addition, in the case of the amorphous atom model, for example, a minimum distance between atoms and atomic density may be set to be a predetermined density ratio (e.g., about 99% of the F.C.C. structure in the case of Pt) based on the theoretical crystal structure of the nanoparticle to be measured, and it is possible to generate the amorphous atom model by randomly generating the atomic positions under those conditions.

The three-dimensional learning data generator 120 may simulate and three-dimensionally reconstruct three-dimensional tomography based on the one or more three-dimensional atomic models to generate the three-dimensional atomic structure tomogram volume data corresponding to the nanomaterial to be measured as three-dimensional learning data. Referring to FIG. 1, the three-dimensional learning data generator 120 may include a three-dimensional (3D) data generator 122, a tilt series generator 124, and a three-dimensional (3D) atomic structure tomogram volume data generator 126.

The three-dimensional data generator 122 may generate three-dimensional atomic level structure volume data corresponding to the nanomaterial to be measured based on the one or more three-dimensional atomic models. Referring to FIG. 2, the three-dimensional atomic level structure volume data generated by the three-dimensional data generator 122 may be generated as ideal three-dimensional atomic level structure volume data 232 for generating a three-dimensional learning data set 230, and may be generated as a three-dimensional target data set 220. The three-dimensional learning data set is a data set that is simulated and generated to reflect problems in tomography of an electron microscope such as a missing wedge, and the three-dimensional target data set is a data set that excludes problems in the tomography of the electron microscope, and is generated simply by simulating ground truth information.

Specifically, the three-dimensional atomic level structure volume data generated by the three-dimensional data generator 122 may be generated as the ideal three-dimensional atomic level structure volume data 232 used to generate the three-dimensional learning data set. The ideal three-dimensional atomic level structure volume data may be generated by deriving a three-dimensional volume of atomic potential based on the one or more three-dimensional models and acquiring a result of convolution of a Gaussian distribution having the atomic potential and a predetermined standard deviation at each atomic position. When generating the ideal three-dimensional atomic level structure volume data, a Gaussian distribution having a standard deviation of 1.4 corresponding to Bfactor of 5 may be used. The fact that Bfactor is 5 means substituting 5 into the "Bfactor" part of the following equation (1), and its standard deviation value may be 1.4. The unit of the standard deviation may be voxels.

Here, the standard deviation σ of the Gaussian Kernel may be calculated by the following equation (1).

$$\sigma = (Bfactor/2\pi^2/pixel\ size^2)^{0.5} \quad \text{Equation (1)}$$

Here, the Bfactor may be calculated by the following equation (2).

$$Bfactor = 2\pi^2 \times \sigma^2 \times pixel\ size^2 \quad \text{Equation (2)}$$

In addition, the three-dimensional atomic level structure volume data generated by the three-dimensional data generator 122 may be generated as a three-dimensional (3D) target data set 220. The three-dimensional atomic level structure volume data used as the three-dimensional target data set may generate, as the three-dimensional target data set, the three-dimensional atomic level structure volume data acquired by deriving a three-dimensional volume of atomic potential based on the one or more three-dimensional models and positioning the Gaussian distribution having the standard deviation equal to or different from the predetermined standard deviation at each atomic position in the three-dimensional volume. That is, it may be obtained by directly positioning the Gaussian distribution having a predetermined appropriate standard deviation at each atomic position. When generating the three-dimensional target data set, the Gaussian distribution having the standard deviation corresponding to Bfactor of 4 may be used. In such a case, by substitution into the above Equation (1) and confirming, standard deviation=(Bfactor=4/2π²/pixel size=0.357²)$^{0.5}$=1.3.

When the three-dimensional atomic level structure volume data generated by the three-dimensional data generator 122 is generated as the ideal three-dimensional atomic level structure volume data 232, the tilt series generator 124 may generate the tilt series by simulating the three-dimensional tomography for the plurality of different angles within the predetermined angle range for at least some of the three-dimensional (3D) atomic level structure volume data (234). According to an embodiment of the present disclosure, the tilt series generator 124 may generate the tilt series by acquiring linear projection from a three-dimensional atomic potential volume at the plurality of different tilt angles within the predetermined angle range (for example, angle range from −71.6° to +71.6°, preferably, angle range from −65° to +65°) for at least some of the three-dimensional atomic level structure volume data. The angle range from −65° to +65° is an angle range in which a specimen may be measured due to geometric limitations of measurement in the current atomic electron tomography (AET). The tilt series may be obtained by performing the linear projection from the three-dimensional atomic potential volume at the plurality of angles that change at equal intervals within the angle range. Further, the linear projection is performed from the three-dimensional atomic potential volume, and then Poisson noise may be added to the projections to simulate a noise effect.

The three-dimensional atomic structure tomogram volume data generator 126 may generate the three-dimensional (3D) atomic structure tomogram volume data set, that is, the three-dimensional learning data, which is acquired by performing the three-dimensional (3D) reconstruction on at least some of the three-dimensional (3D) atomic level structure volume data based on the tilt series (236, 238). The three-dimensional atomic structure tomogram volume data generator 126 may perform the three-dimensional reconstruction from the tilt series using GENFIRE algorithm, but is not limited to this algorithm. In this three-dimensional reconstruction, an axis convention may be selected so that at least one of an x-direction axis, a y-direction axis, and a z-direction axis is parallel to a missing wedge direction. This method enables predictive recovery by successfully simulating undesirable defects along the vertical direction (i.e., the missing wedge direction). A fast Fourier transform (FFT) interpolation method may be used for three-dimensional reconstruction using the GENFIRE algorithm. However, the axis convention for the three-dimensional reconstruction may be selected to be parallel to the missing wedge direction for any direction as needed.

The three-dimensional atomic structure tomogram volume data set thus generated may be divided into a pure learning data set for the deep learning filter and a test data set at a predetermined ratio. The ratio between the learning data set and the test data set may be 8:1 to 10:1.

The verifier 130 may verify the reliability of the generated data sets. A machine learning model may be used for such verification.

According to the configuration of the data generating apparatus of the present disclosure, it is possible to generate in large quantities and amplify the highly reliable data even for areas where some data for the three-dimensional atomic level structure or the three-dimensional surface atomic level structure is lost or data is insufficient due to various external and/or internal factors of nanomaterials. Therefore, sufficient learning is possible for the optimization of the deep learning filter.

Figure 3:
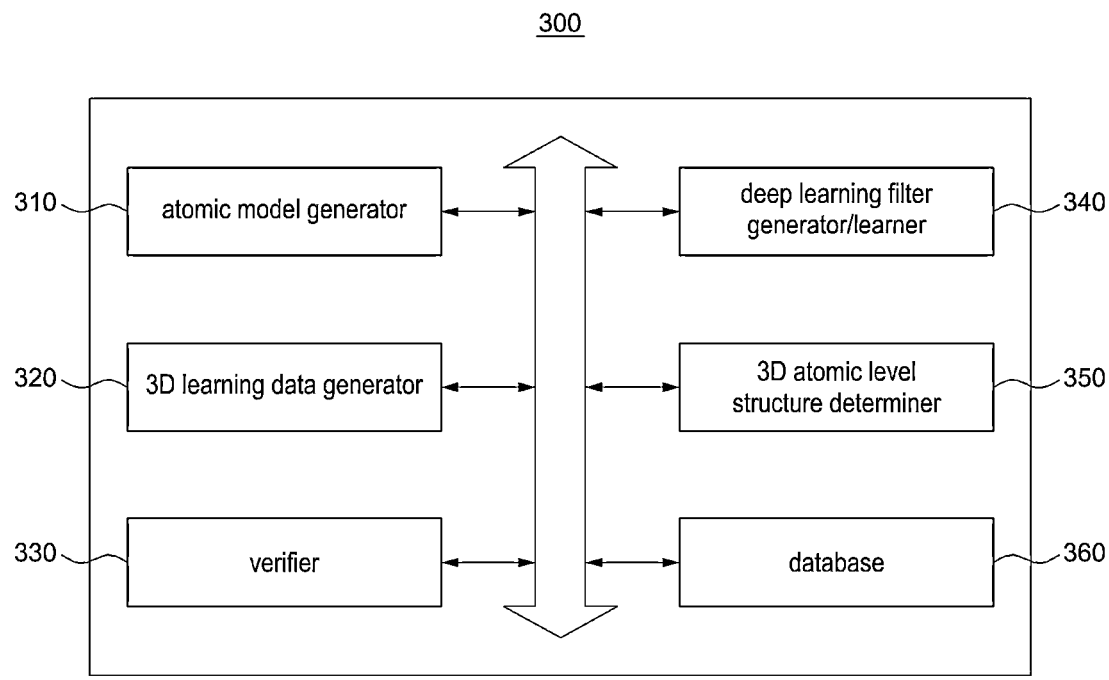
FIG. 3 is a schematic block diagram of an apparatus for determining a three-dimensional atomic level structure of nanoparticles according to an embodiment of the present disclosure.

FIG. 3 is a schematic block diagram of an apparatus 300 for determining a three-dimensional atomic level structure of nanomaterials according to an embodiment of the present disclosure.

Referring to FIG. 3, the apparatus 300 for determining a three-dimensional (3D) atomic level structure includes an atomic model generator 310, a three-dimensional (3D) learning data generator 320, a verifier 330, a deep learning filter generator/learner 340, three-dimensional (3D) atomic level structure determiner 350, and a database 360. The apparatus 300 for determining a three-dimensional (3D) atomic level structure may not include the verifier 330 and/or the database 360, and may be connected to an external verification system or a data storage system, or a server or a cloud system including them, and may use them instead.

The atomic model generator 310 may generate one or more three-dimensional atomic models corresponding to the nanomaterial to be measured. The one or more three-dimensional atomic model may be a three-dimensional atomic model based on a theoretical crystal structure of nanomaterials to be measured and/or a three-dimensional atomic model based on an amorphous structure. The configuration and function of the atomic model generator 310 corresponds to the atomic model generator 110 of the data generating apparatus 100 of FIG. 1.

FIG. 2 illustrates a schematic diagram of the atomic model generation 210 and the three-dimensional (3D) atomic level structure volume data generation 220 and 230 when the nanomaterial to be measured is a Pt nanoparticle according to an embodiment of the present disclosure. In FIG. 2, the atomic model generator generates an atomic model (hereinafter, "face centered cubic lattice (F.C.C.) atomic model") 212 corresponding to the F.C.C. structure which is a theoretical crystal structure of Pt nanoparticles and/or an atomic model (hereinafter, "amorphous atomic model") 214 corresponding to an amorphous structure.

When generating the one or more three-dimensional atomic models, processing considering at least one of the actualization correction processing including the random atomic defect provision, the random rotation or movement of the model structure, the spatial change, and the atomic density change may be performed in the three-dimensional atomic level arrangement structure of each atomic model.

The three-dimensional learning data generator 320 may simulate and reconstruct the three-dimensional tomography based on the one or more three-dimensional atomic models to generate the three-dimensional atomic structure tomogram volume data corresponding to the nanomaterial to be measured as the three-dimensional learning data.

The three-dimensional learning data generator 320 may be configured to include: a three-dimensional data generator that generates three-dimensional atomic level structure volume data corresponding to the nanomaterial to be measured based on the one or more three-dimensional atomic model; a tilt series generator that generates a tilt series by simulating three-dimensional tomography for a plurality of different angles in a predetermined angle range for at least some of the three-dimensional atomic level structure volume data; and a three-dimensional atomic structure tomogram volume data generator that generates a three-dimensional atomic structure tomogram volume data set by performing three-dimensional reconstruction on at least some of the three-dimensional atomic level structure volume data based on the tilt series. The reconstructed three-dimensional atomic structure tomogram volume data set may form a three-dimensional learning data set for the training of the deep learning filter.

The three-dimensional learning data generator 320 and its detailed components may include a configuration and/or function corresponding to the three-dimensional learning data generator 120 of the data generating apparatus 100 of FIG. 1.

The three-dimensional data generator in the three-dimensional learning data generator may generate, as the three-dimensional target data set, the three-dimensional atomic level structure volume data acquired by deriving the three-dimensional volume of the atomic potential based on the one or more three-dimensional models and positioning the Gaussian distribution having the standard deviation equal to or different from the predetermined standard deviation at each atomic position in the three-dimensional volume.

Figure 4:
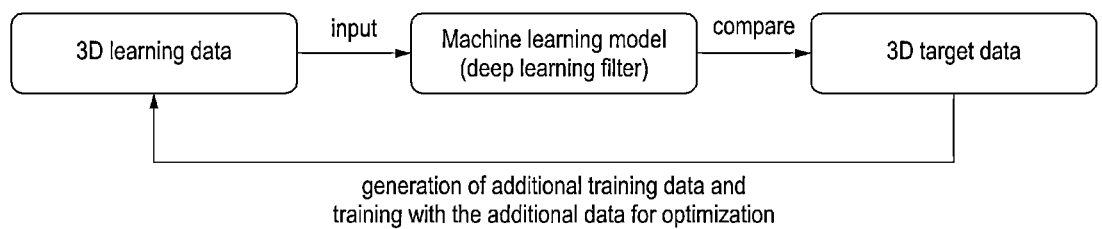
FIG. 4 is a conceptual diagram of generating a deep learning filter by training a machine learning model according to an embodiment of the present disclosure, or training an existing deep learning filter.

The deep learning filter generator/learner 340 may generate the deep learning filter by training the machine learning model using the three-dimensional learning data. FIG. 4 illustrates a schematic diagram of generating a deep learning filter by training a machine learning model according to an embodiment of the present disclosure, or training an existing deep learning filter.

In the embodiment of FIG. 4, The deep learning filter generator/learner may calculate an error by comparing a result output from the deep learning filter through forward-propagation based on the three-dimensional learning input data set with the three-dimensional target data set, and update hyperparameters of the deep learning filter in a manner, in which the error is reduced, by calculating (back-propagation) a gradient of the error in a reverse direction (from an output layer to an input layer) based on the error. By repeating this process, the deep learning filter can be trained and the parameters of the filter can be optimized to determine the three-dimensional atomic level structure.

The machine learning model used to generate the deep learning filter may use a neural network (NN)-based model, and at least one of a deep feedforward network (DFN), a recurrent neural network (RNN), a convolutional neural network (CNN), a deep residual network (DRN), and a generative adversarial network (GAN) may be used. However, the machine learning model is not limited to such a neural network model, and a machine learning model other than a neural network model may be used.

The three-dimensional atomic level structure determiner 350 may generate second three-dimensional atomic structure tomogram volume data, in which an atomic arrangement region with insufficient data is corrected, by filtering first three-dimensional atomic structure tomogram volume data acquired through electron microscopy measurement of the nanomaterial to be measured with the deep learning filter, and determine a three-dimensional atomic level nanostructure of the nanomaterial to be measured based on the second three-dimensional atomic structure tomogram volume data.

Figure 5:
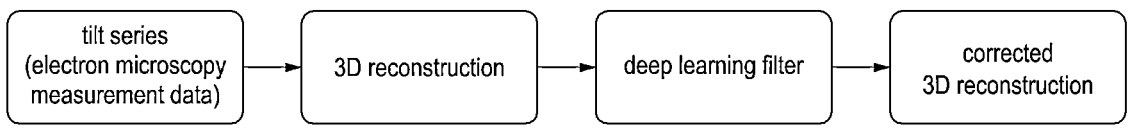
FIG. 5 is a conceptual diagram of acquiring corrected three-dimensional atomic structure tomogram volume data with improved reliability according to an embodiment of the present disclosure.

FIG. 5 illustrates a conceptual diagram of acquiring the corrected three-dimensional atomic structure tomogram volume data with improved reliability by applying the deep learning filter generated or trained by the deep learning filter generator/learner 340 to the actual three-dimensional atomic structure tomogram volume data acquired by measurement by the electron microscope according to the embodiment of the present disclosure.

Figure 6:
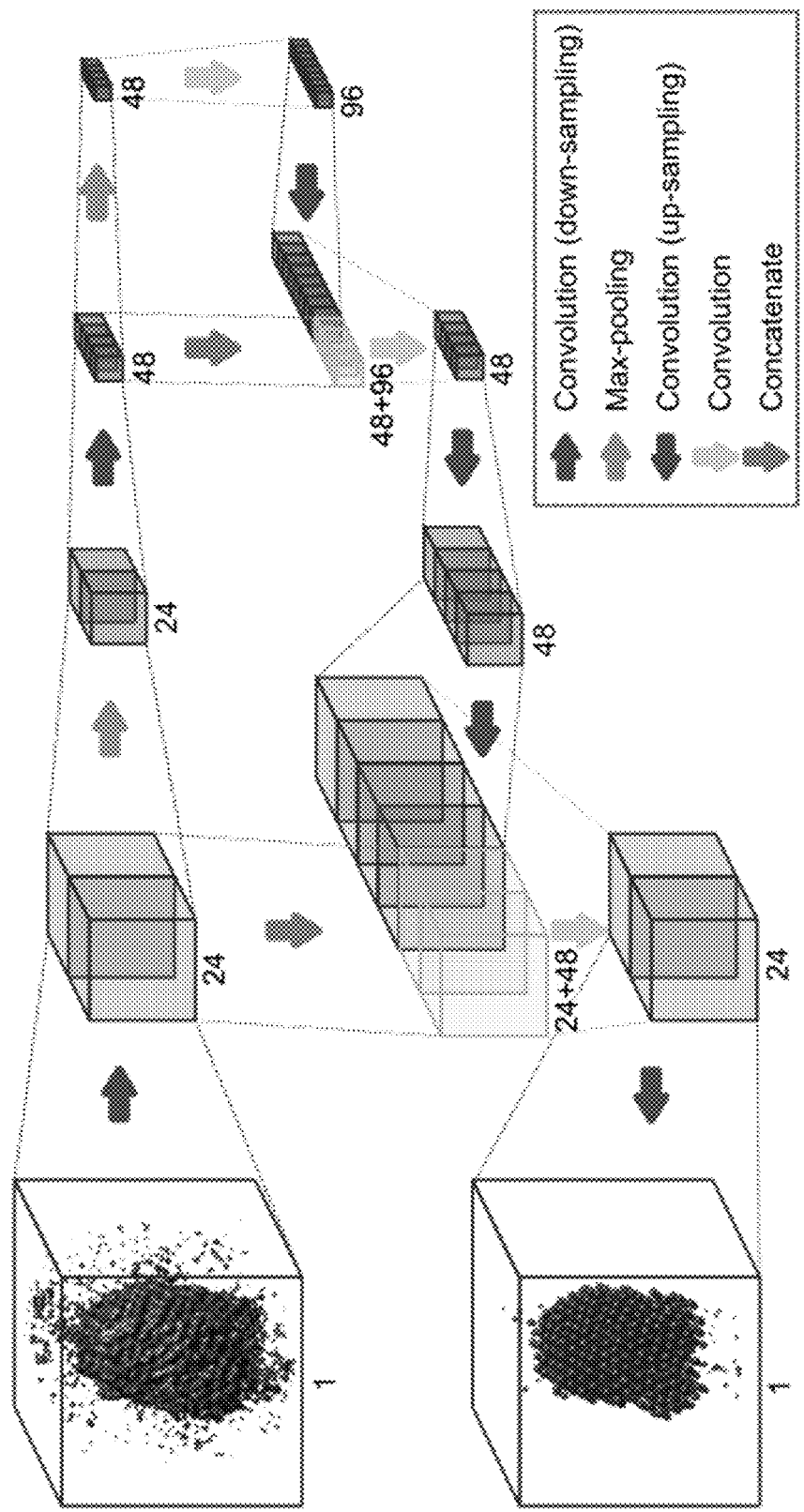
FIG. 6 is an architectural diagram of a neural network model structure based on three-dimensional-UNET used as the deep learning filter according to the embodiment of the present disclosure.

FIG. 6 illustrates an architecture of a neural network model structure based on three-dimensional-UNET used as the deep learning filter according to the embodiment of the present disclosure. In FIG. 6, a set of boxes represents feature maps, and a number under each feature map represents the number of channels. The neural network is designed to reduce a size of feature maps as the layer deepens. An encoder can be configured of two 3×3×3 convolutions and 2×2×2 max-pooling for down-sampling. A decoder can be configured of four 3×3×3 transposed convolutions for up-sampling. In addition, a dropout method may be used for specific layers to prevent overfitting.

According to the configuration of the apparatus for determining a three-dimensional atomic level structure of nanomaterials according to the embodiment of the present disclosure, all deep learning filters showed consistent output regardless of the basic crystal structure of the nanomaterials for the learning data, and the proper F.C.C. ground truth structures of the test data sets may be recovered even by a filter trained by an amorphous structure. In addition, when comparing the differences before and after the application of such a deep learning filter, significant improvement in accuracy of three-dimensional atomic identification of nanomaterials and precision of atomic coordinate has also been demonstrated.

Figure 7:
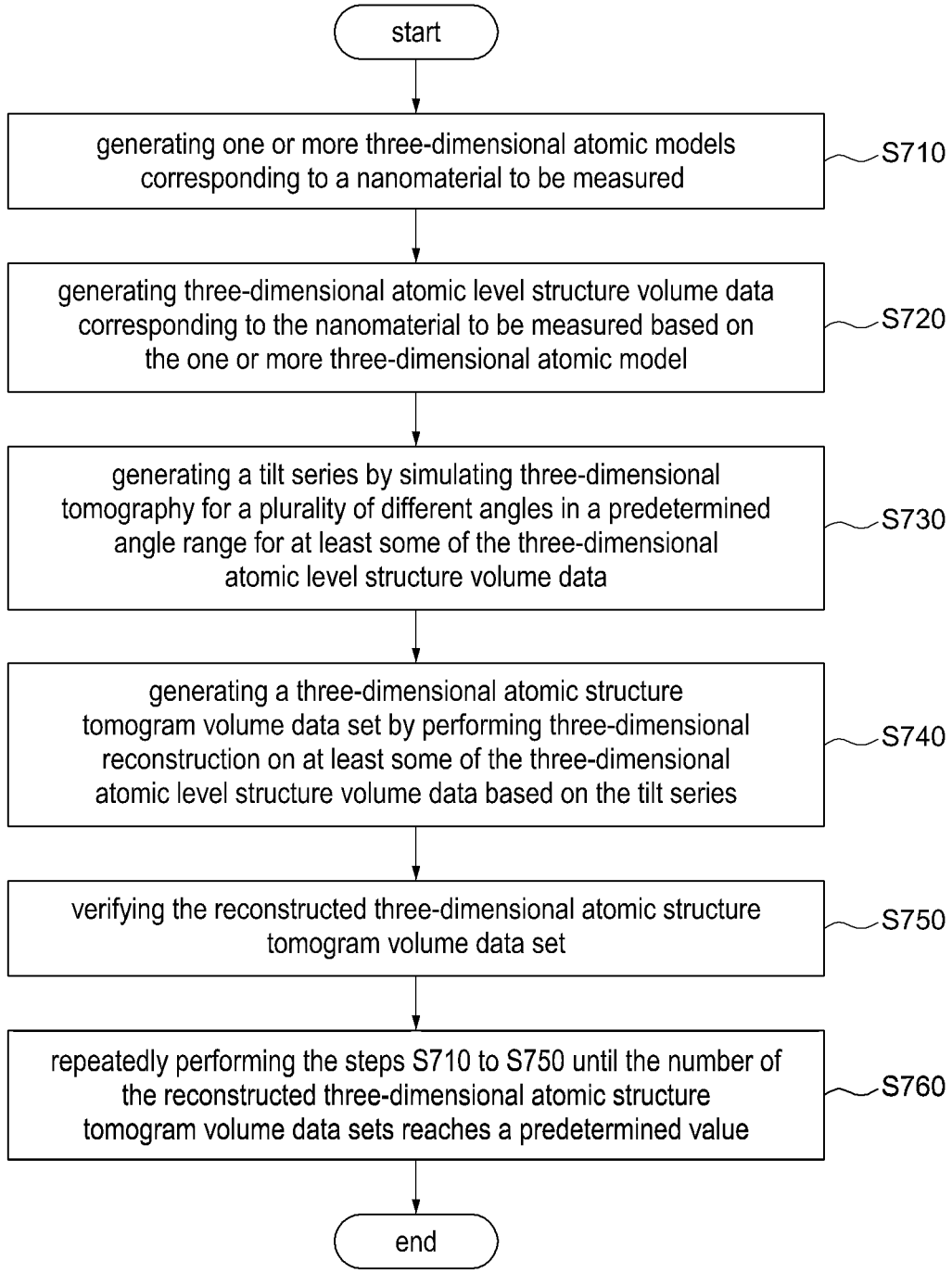
FIG. 7 is a schematic flowchart of a data generating method for learning data of the deep learning filter according to an embodiment of the present disclosure.

FIG. 7 is a schematic flowchart of a data generating method for learning data of the deep learning filter according to the embodiment of the present disclosure. This data generating method may be performed by the data generating apparatus 100 of FIG. 1.

Referring to FIG. 7, a data generating method according to an embodiment of the present disclosure includes: an atomic model generating step of generating one or more three-dimensional atomic models corresponding to a nanomaterial to be measured (S710); a three-dimensional data generating step of generating three-dimensional atomic level structure volume data corresponding to the nanomaterial to be measured based on the one or more three-dimensional atomic model (S720); a tilt series generating step of generating a tilt series by simulating three-dimensional tomography for a plurality of different angles in a predetermined angle range for at least some of the three-dimensional atomic level structure volume data (S730); and a three-dimensional atomic structure tomogram volume data generating step of generating a three-dimensional atomic structure tomogram volume data set by performing three-dimensional reconstruction on at least some of the three-dimensional atomic level structure volume data based on the tilt series (S740). In addition, the data generating method according to one embodiment of the present disclosure may further include a step of verifying the reconstructed three-dimensional atomic structure tomogram volume data set (S750). The steps S710 to S750 may be repeatedly processed until the number of the reconstructed three-dimensional atomic structure tomogram volume data sets reaches a predetermined value (S760).

The atomic model generating step may further include generating a three-dimensional atomic model based on a theoretical crystal structure of the nanomaterial to be measured and a three-dimensional atomic model based on an amorphous structure.

Referring to FIG. 2, in the step of generating the atomic model of the Pt nanoparticles according to the embodiment of the present disclosure, an atomic model (hereinafter, "face centered cubic lattice (F.C.C.) atomic model") 212 corresponding to the F.C.C. structure which is a theoretical crystal structure of the Pt nanoparticles and/or an atomic model (hereinafter, "amorphous atomic model") 214 corresponding to an amorphous structure are generated.

In addition, the one or more three-dimensional atomic models may include three or more atomic models. For example, two or more atomic models may be generated by assigning different B factor values based on the theoretical crystal structure of nanomaterials to be measured or the amorphous structure and may be used for data generation.

When generating the one or more three-dimensional atomic models, processing considering at least one of the actualization correction processing including the random atomic defect provision, the random rotation or movement of the model structure, the spatial change, and the atomic density change may be performed in the three-dimensional atomic level arrangement structure of each atomic model.

In the three-dimensional data generating step (S720), the three-dimensional atomic level structure volume data corresponding to the nanomaterial to be measured may be generated based on the one or more three-dimensional atomic models. Referring to FIG. 2, the three-dimensional atomic level structure volume data generated in the three-dimensional data generating step (S710) may be generated as ideal three-dimensional (3D) atomic level structure volume data 232 for generating the three-dimensional (3D) learning data set 230, and may be generated as the three-dimensional target data set 220. The three-dimensional learning data set is a data set that is simulated and generated to reflect problems in tomography of an electron microscope such as a missing wedge, and the three-dimensional target data set is a data set that excludes problems in the tomography of the electron microscope, and is generated simply by simulating ground truth information.

Specifically, the three-dimensional atomic level structure volume data may be the ideal three-dimensional atomic level structure volume data 232 used to generate the three-dimensional learning data set. The ideal three-dimensional atomic level structure volume data may be generated by deriving a three-dimensional volume of atomic potential based on the one or more three-dimensional models and acquiring a result of convolution of a Gaussian distribution having the atomic potential and a predetermined standard deviation at each atomic position. When generating the ideal three-dimensional atomic level structure volume data, a Gaussian distribution having a standard deviation corresponding to Bfactor of 5 may be used.

In addition, the three-dimensional atomic level structure volume data may be used as the three-dimensional target data set 220. The three-dimensional atomic level structure volume data used as the three-dimensional target data set may be acquired by deriving the three-dimensional volume of the atomic potential based on the one or more three-dimensional models, and positioning a Gaussian distribution having a standard deviation equal to or different from the standard deviation used to generate the ideal three-dimensional atomic level structure volume data at each atomic position in the three-dimensional volume. When generating the three-dimensional target data set, the Gaussian distribution having the standard deviation corresponding to B factor of 4 may be used.

In the tilt series generating step (S730), the tilt series may be generated by simulating the three-dimensional tomography for the plurality of different angles in the predetermined angle range for at least some of the three-dimensional atomic level structure volume data. According to an embodiment of the present disclosure, when generating the tilt series, the tilt series may be generated by acquiring the linear projection from a three-dimensional atomic potential volume at the plurality of different tilt angles within the predetermined angle range (for example, angle range from −71.6° to +71.6°, preferably, angle range from −65° to +65°) for at least some of the three-dimensional atomic level structure volume data. The angle range from −65° to +65° is an angle range in which a specimen may be measured due to geometric limitations of measurement in the current atomic electron tomography (AET). The tilt series may be obtained by performing the linear projection from the three-dimensional atomic potential volume at the plurality of angles that change at equal intervals within the angle range. Further, the linear projection is performed from the three-dimensional atomic potential volume, and then Poisson noise may be added to the projections to simulate a noise effect.

In the three-dimensional atomic structure tomogram volume data generating step (S740), the three-dimensional atomic structure tomogram volume data set, that is, the three-dimensional learning data, which is acquired by performing the three-dimensional reconstruction on at least some of the three-dimensional atomic level structure volume data based on the tilt series may be generated. The three-dimensional atomic structure tomogram volume data generator 126 may perform the three-dimensional reconstruction from the tilt series using GENFIRE algorithm, but is not limited to this algorithm. In this three-dimensional reconstruction, the axis convention may be selected so that at least one of the x-direction axis, the y-direction axis, and the z-direction axis is parallel to the missing wedge direction. However, in this three-dimensional reconstruction, the axis convention may be selected so that any specific direction other than the x-direction axis, the y-direction axis, and the z-direction axis is parallel to the missing wedge direction as needed. A fast Fourier transform (FFT) interpolation method may be used for three-dimensional reconstruction using the GENFIRE algorithm.

The three-dimensional atomic structure tomogram volume data set thus generated may be divided into a pure learning data set for the deep learning filter and a test data set at a predetermined ratio. The ratio between the learning data set and the test data set may be 8:1 to 10:1.

In the verification step (S750), the reliability of the generated data sets may be verified, and the step may be selectively included in the data generating method. A machine learning model may be used for such verification.

Figure 8:
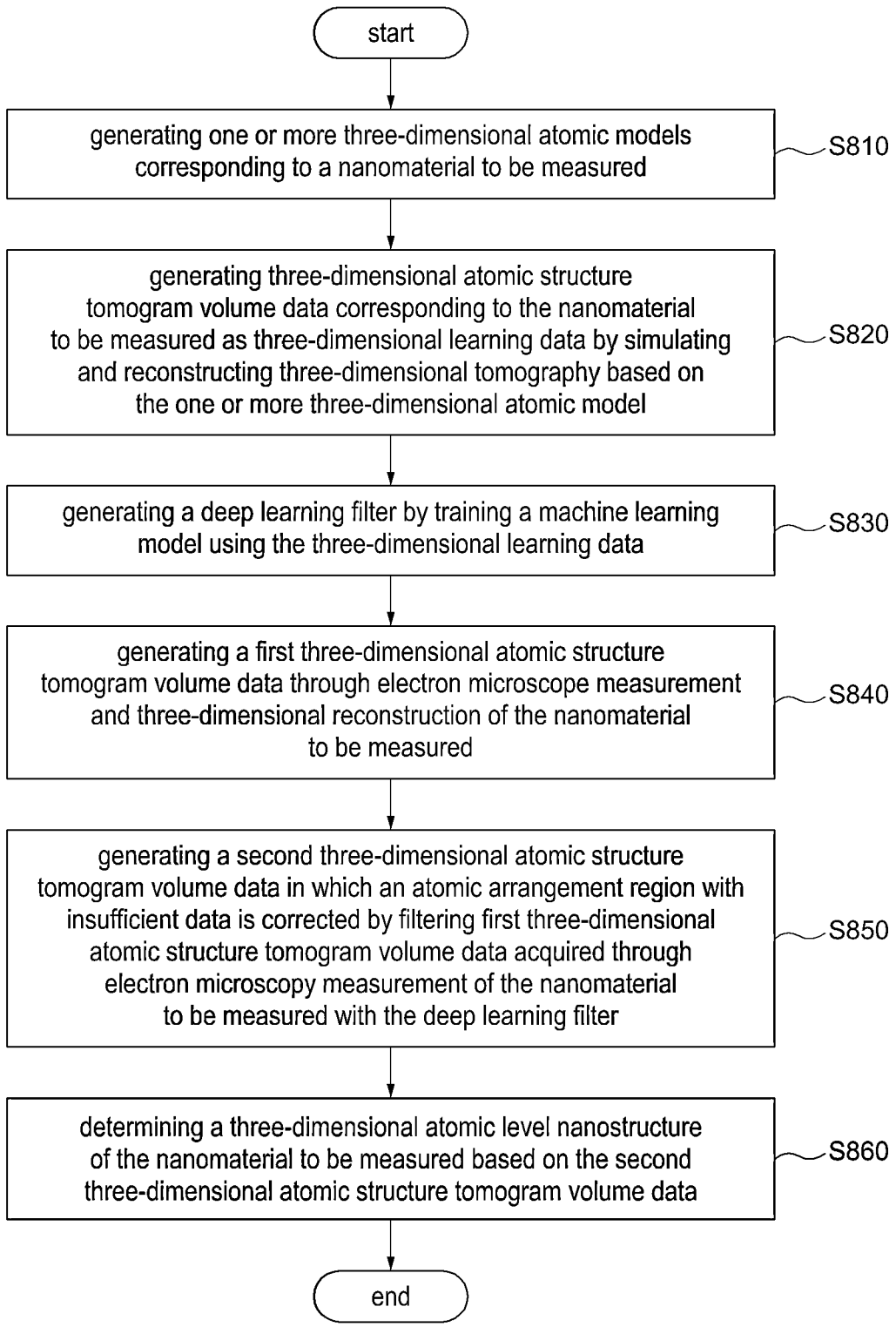
FIG. 8 is a schematic flowchart of a method for determining a three-dimensional atomic level structure of nanomaterials according to an embodiment of the present disclosure.

FIG. 8 is a schematic flowchart of a method for determining a three-dimensional atomic level structure of nanomaterials according to an embodiment of the present disclosure.

Referring to FIG. 8, a method for determining a three-dimensional atomic level structure of a nanomaterial according to an embodiment of the present disclosure may include: an atomic model generating step of generating one or more three-dimensional atomic models corresponding to a nanomaterial to be measured (S810); a three-dimensional learning data generating step of generating three-dimensional atomic structure tomogram volume data corresponding to the nanomaterial to be measured as three-dimensional learning data by simulating and reconstructing three-dimensional tomography based on the one or more three-dimensional atomic model (S820); a deep learning filter generating/learning step of generating a deep learning filter by training a machine learning model using the three-dimensional learning data (S830); a first three-dimensional atomic structure tomogram volume data generating step of generating a first three-dimensional atomic structure tomogram volume data through electron microscope measurement and three-dimensional reconstruction of the nanomaterial to be measured (S840); a second three-dimensional atomic structure tomogram volume data generating step of generating a second three-dimensional atomic structure tomogram volume data, in which an atomic arrangement region with insufficient data is corrected, by filtering first three-dimensional atomic structure tomogram volume data acquired through electron microscopy measurement of the nanomaterial to be measured with the deep learning filter(S850); and three-dimensional atomic level structure determining step of determining a three-dimensional atomic level nanostructure of the nanomaterial to be measured based on the second three-dimensional atomic structure tomogram volume data (S860).

As illustrated in FIG. 7, the three-dimensional learning data generating step (S820) may include: a three-dimensional data generating step (S720) of generating three-dimensional atomic level structure volume data corresponding to the nanomaterial to be measured based on the one or more three-dimensional atomic model; a tilt series generating step (S730) of generating a tilt series by simulating three-dimensional tomography for a plurality of different angles in a predetermined angle range for at least some of the three-dimensional atomic level structure volume data; and a three-dimensional atomic structure tomogram volume data generating step (S740) of generating a three-dimensional atomic structure tomogram volume data set by performing three-dimensional reconstruction on at least some of the three-dimensional atomic level structure volume data based on the tilt series. At this time, the acquired three-dimensional atomic structure tomogram volume data set may form the three-dimensional learning data set for the training of the deep learning filter.

The deep learning filter generating/learning step (S830) may further include a step of optimizing parameters of the deep learning filter to determine a three-dimensional atomic level structure. The optimizing step may include calculating an error by comparing a result output from the deep learning filter through forward-propagation based on the three-dimensional learning input data set with the three-dimensional target data set, updating hyperparameters of the deep learning filter in a manner, in which the error is reduced, by calculating (back-propagation) a gradient of the error in a reverse direction (from an output layer to an input layer) based on the error, and training the deep learning filter and optimizing the parameters of the filter to determine the three-dimensional atomic level structure by repeating the process.

Embodiment

An embodiment of generating a three-dimensional input and target data set to be used to train a neural network model for determining the three-dimensional atomic level structure of Pt nanoparticles is provided.

First of all, in this embodiment, 11,000 sets (10,000 for training and 1,000 for testing) of a simulation tomography (for input data) and a ground truth three-dimensional volume (for target data) according to the data generating apparatus and the data generating method according to the embodiment of the present disclosure of FIG. 1 were generated. The simulation tomography was prepared through the following four-step process.

First, in the atomic model generating step (S710), first, to generate a F.C.C. crystal structure-based atomic model, randomly shaped three-dimensional volumes of 17,000 Å$^3$ to 27,000 Å$^3$ without cavities were generated. Thereafter, the atoms were located in a three-dimensional volume based on the F.C.C. structure with a lattice constant of 3.912 Å in random orientation. In order to imitate the actual nanomaterial atomic structure from such F.C.C.-based atomic model, about 0.5% of the atoms were randomly removed to simulate atomic defects, and a random spatial displacement of root mean square deviation of about 22 pm was also applied to each atom, so an atomic model was constructed close to the actual nanoparticles.

In addition, in order to generate an amorphous structure-based atomic model, randomly shaped three-dimensional volumes of 23,000 Å$^3$ to 34,000 Å$^3$ without cavities were generated. Thereafter, the atomic positions were randomly generated and located within the volume with the constrained conditions of a minimum distance of 2.0 Å between atoms, until 99% of atomic density was reached when compared to the volume of the F.C.C. structure.

Second, in the three-dimensional atomic level structure volume data generating step (S720), the three-dimensional volumes of atomic potential were calculated based on the three-dimensional atomic structure. The atomic potentials were obtained by Fourier transform of the electron scattering factor. The atomic potentials were convolved with Gaussian Kernel to account for thermal vibration and electron beam size effects. The standard deviation $\sigma$ of the Gaussian Kernel is $\sigma(\text{Bfactor}/2\pi^2/\text{pixel size}^2)^{0.5}$. A pixel size of 0.357 Å was used, and Bfactors were randomly selected from a Gaussian distribution with an average of 5 and a standard deviation of 1. When the Bfactor is 5, it shows the best consistency between the simulated projections and the experimental tilt series images.

Also, the target data sets (ground truth information) were generated according to the above step 1. At each atomic position, a Gaussian Intensity distribution having a standard deviation σ corresponding to B factor of 4 was located, which showed the best performance in the simulation tests.

Third, in the tilt series generating step (S730), the tilt series was generated by taking the linear projection from the three-dimensional atomic potential volumes at each tilt angle. Each tilt series was composed of 21 projections having tilt angles from −65° to +65°. The size of each projection was 144×144 pixels having a pixel size of 0.357 Å. The Poisson noise was added to the projections to simulate the noise effect in the experiment. In order to consider the angular error due to stage instability of the electron microscope facility during the experiment, an arbitrary angular error of maximum±0.3° was added to each tilt angle.

Fourth, in the three-dimensional atomic structure tomogram volume data generating step (S740), the three-dimensional tomography was reconstructed from the tilt series and the tilt angles corresponding thereto using the GENFIRE algorithm. During the three-dimensional reconstruction, the axis convention was selected so that the z-direction axis is parallel to the missing wedge direction. However, other axial directions may be selected to be parallel to the missing wedge direction. In addition, when necessary, during the three-dimensional reconstruction, a certain specific direction may be selected to be parallel to the missing wedge direction. For the GENFIRE reconstruction, the fast Fourier transform (FFT) interpolation method, a number of iterations of 100, an oversampling ratio of 2, and an interpolation radius of 0.3 were used.

The deep learning filter is generated by training the machine learning model with the three-dimensional learning data set 230 and the three-dimensional target data set 220 generated as above, and the deep learning filter is applied to the tomography data of the simulated electron microscope to perform the highly reliable identification and determination on the three-dimensional atomic level structure of nanomaterials.

Figure 9:
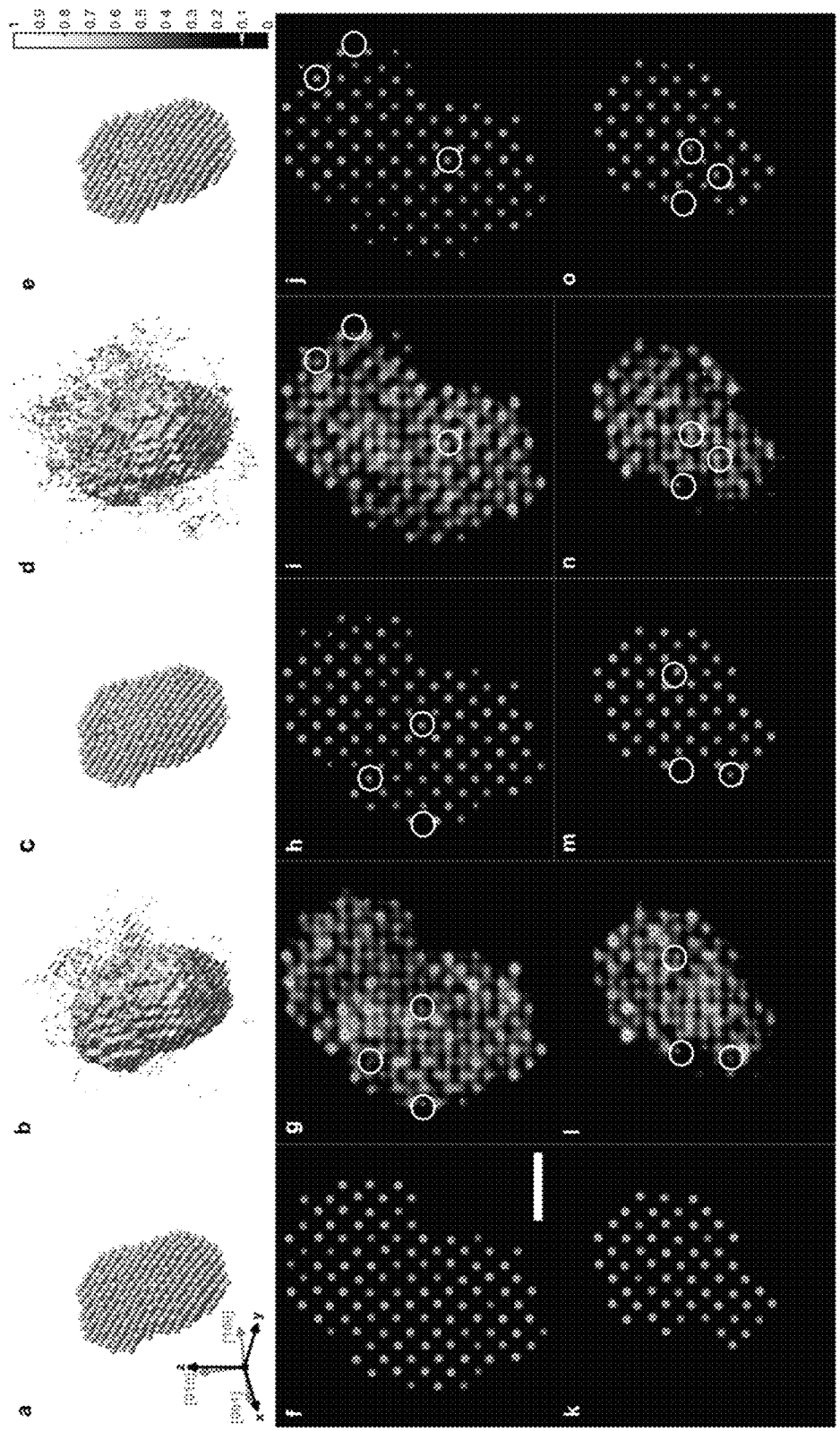
FIG. 9 is an electron microscope photograph and a three-dimensional reconstruction diagram illustrating a state before and after applying a deep learning filter to simulated electron microscope tomography photographs according to an embodiment of the present disclosure.

FIG. 9 is an electron microscope photograph and a three-dimensional reconstruction diagram illustrating a state before and after applying a deep learning filter to simulated electron microscope tomography photographs according to an embodiment of the present disclosure. First, using an atom-tracing method, three-dimensional coordinates of individual atoms are determined from the simulated tomography. Compared to the ground truth structures (FIGS. 9A, 9F, and 9K), the measured tomography data of nanomaterials is not clearly clear due to defects resulting from the missing wedge and noise effect: Atomic intensities are blurry, atoms are elongated to be connected to neighboring atoms, and some misrecognized atoms may be found, particularly around the surface (see FIGS. 9B, 9G, and 9L). These defects can be successfully prevented by applying the atomicity-based deep learning filter according to the present disclosure (FIGS. 9C, 9H, and 9M). The positions of the atomic intensities were properly understood, and thus most of the atoms were recovered correctly.

Figure 10:
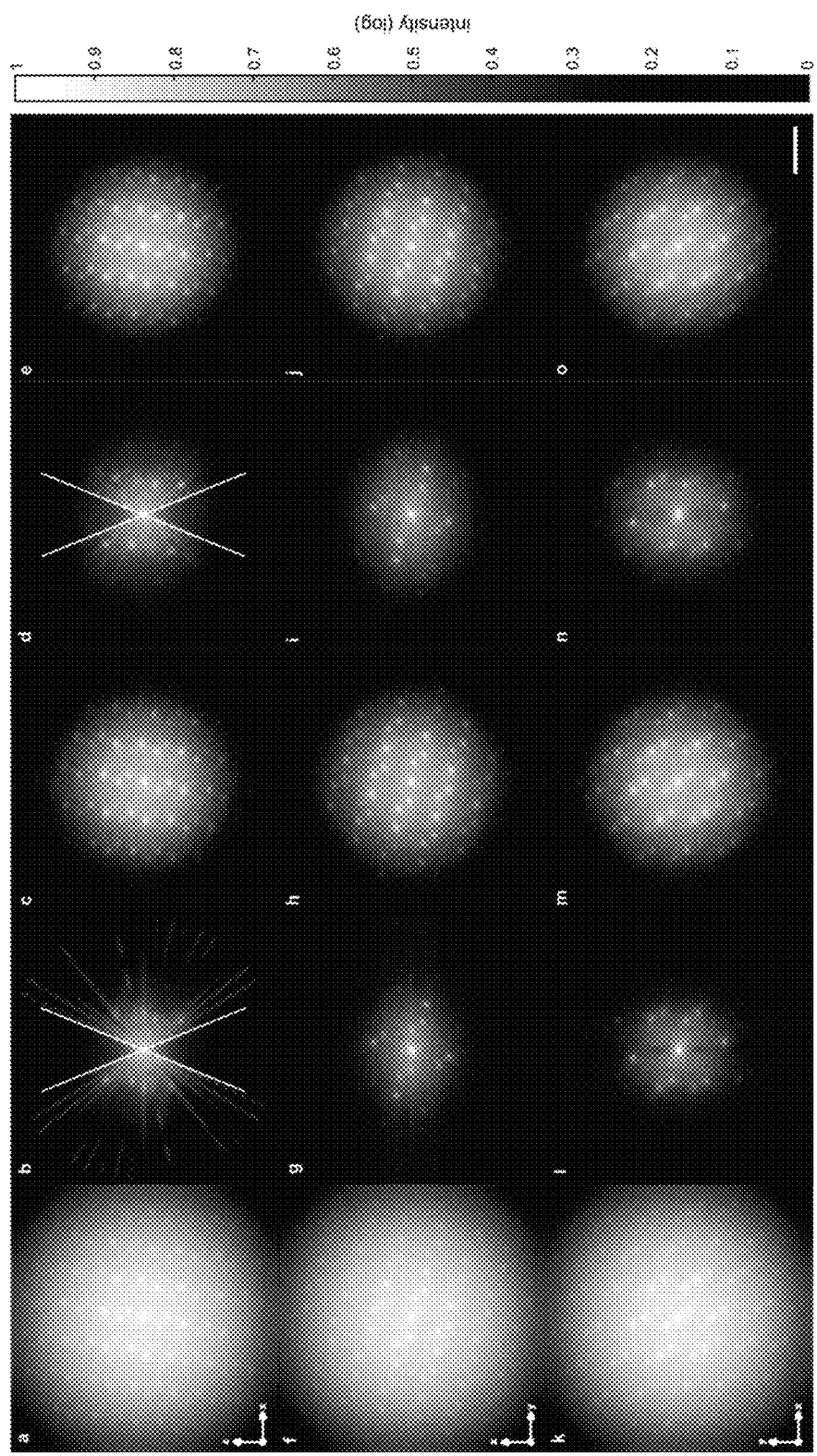
FIG. 10 is a projection diagram in which a three-dimensional Fourier density obtained by applying Fourier transform to simulated three-dimensional reconstructed tomogram according to an embodiment of the present disclosure is projected in different axial directions.

FIG. 10 is a projection diagram in which a three-dimensional Fourier density obtained by applying Fourier transform to simulated three-dimensionally reconstructed tomogram according to an embodiment of the present disclosure is projected in different axial directions.

FIG. 10A illustrates performing the projection, along the y-direction, on the magnitude of the ground truth three-dimensional volume that is subjected to the Fourier transform. FIG. 10B illustrates a projected Fourier magnitude of the electron microscope tomography photograph reconstructed from the linear projections to which the deep learning filter is not applied, and FIG. 10C illustrates the projected Fourier magnitude of the electron microscope tomography photograph reconstructed from the linear projections to which the deep learning filter is applied. FIG. 10D illustrates a projected Fourier magnitude of the electron microscope tomography photograph reconstructed from PRISM projections to which the deep learning filter is not applied, and FIG. 10E illustrates the projected Fourier magnitude of the electron microscope tomography photograph reconstructed from the PRISM projections to which the deep learning filter is applied. FIGS. 10F to 10J illustrate projection images that have conditions similar to those of 10A to 10E, are different in that the projection images are projected along the x-direction. FIGS. 10K to 10O illustrate projection images that also have conditions similar to those of 10A to 10E, but are different in that the projection images are projected along the z-direction.

In FIGS. 10B and 10D, diffraction patterns appear on the left and right sides of the X-shaped axis, but no diffraction patterns are observed in the vertical direction. This is because there is the missing wedge problem in which this angle range cannot be photographed due to the geometric limitation of the electron microscope tomography. However, in FIGS. 10E and 10E, which are after applying the deep learning filter, a constant diffraction pattern is clearly displayed, and thus it can be seen that the problem of data loss due to this missing wedge was successfully recovered and solved by the application of the deep learning filter.

Figure 11:
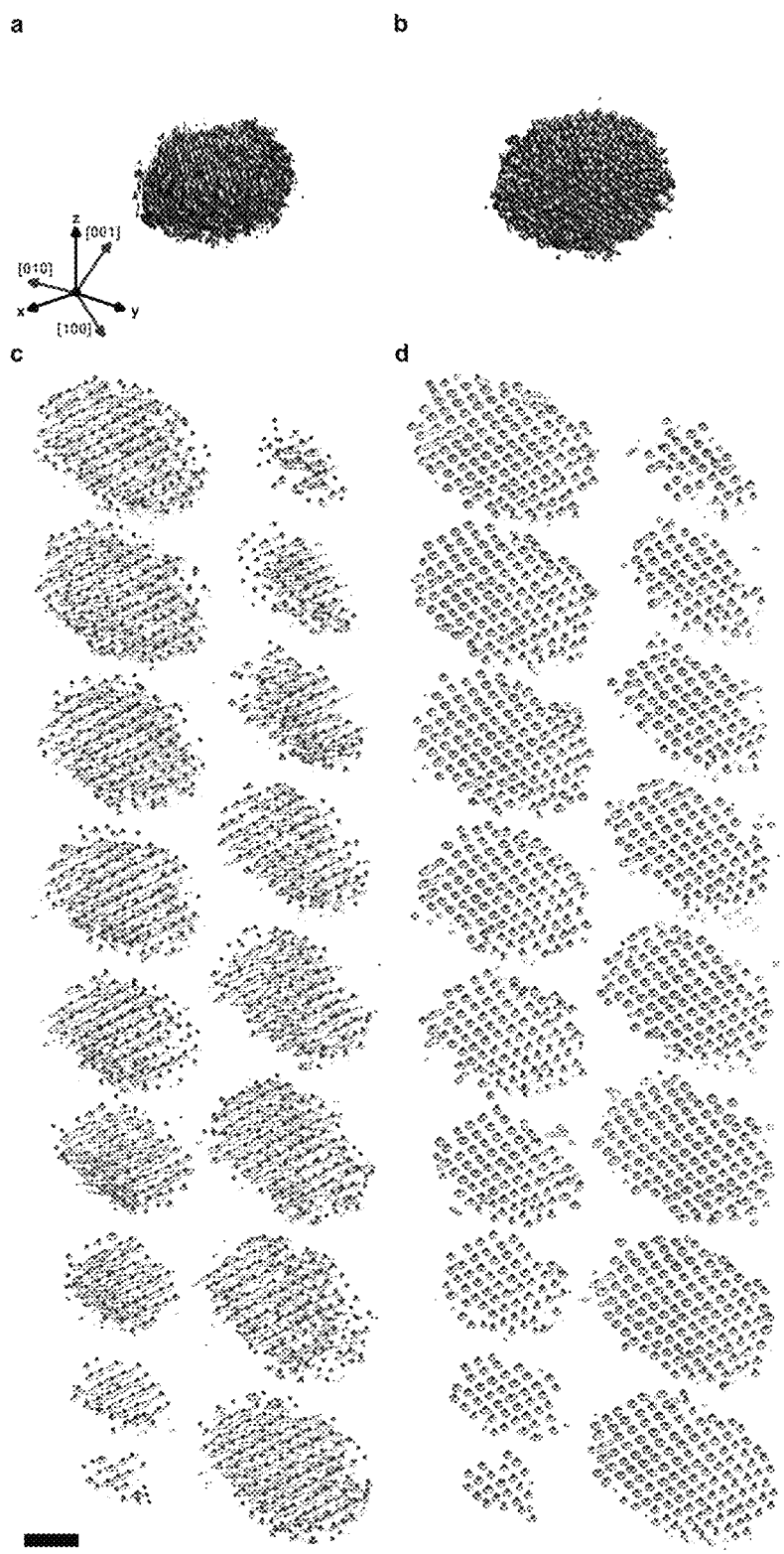
FIG. 11 is a three-dimensional image illustrating before and after deep learning of three-dimensional tomogram reconstructing an electron microscope tilt series acquired by experiment according to an embodiment of the present disclosure.
Figure 12:
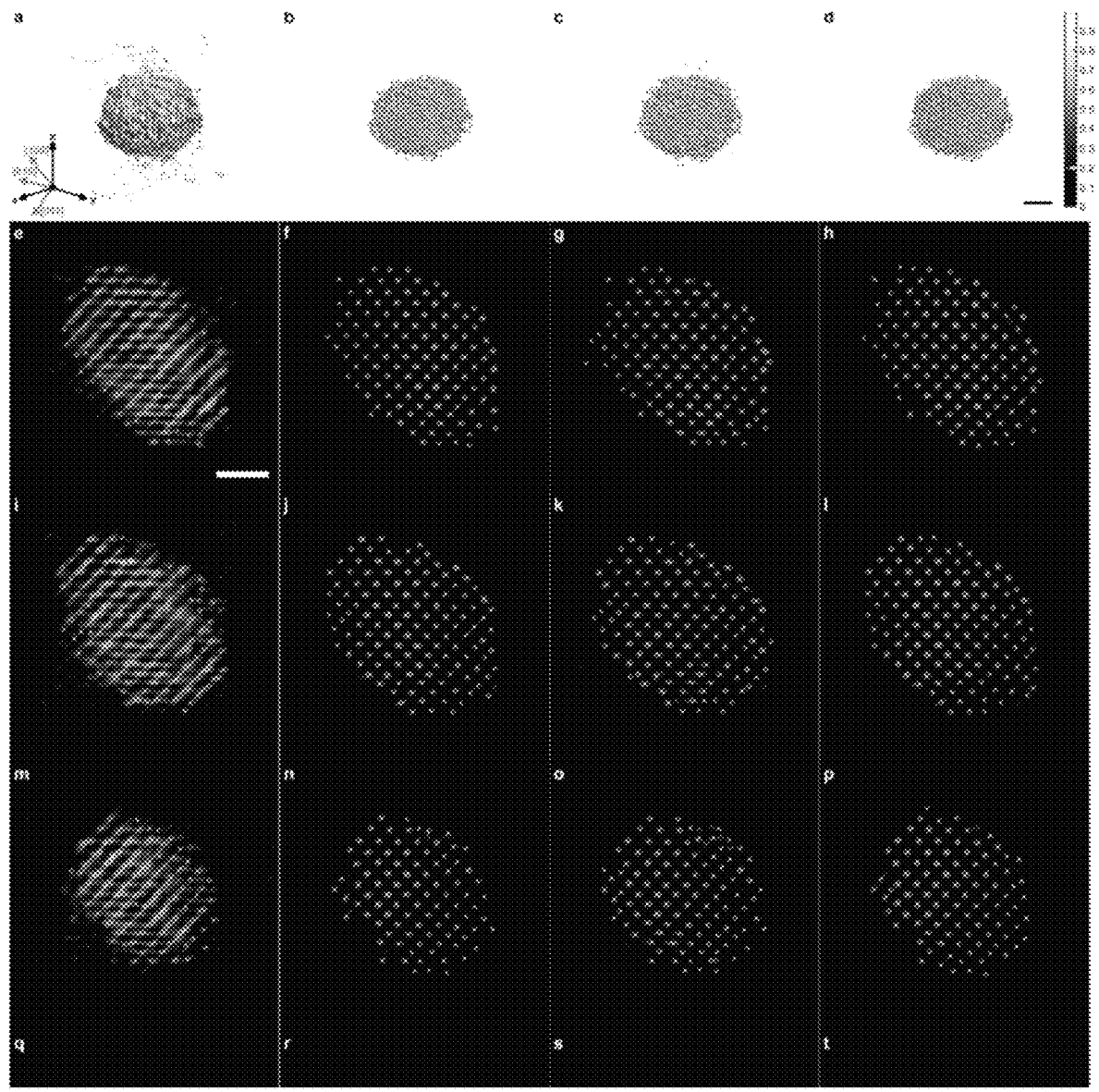
FIG. 12 is an electron microscope photograph and a projection diagram illustrating an effect of applying the deep learning filter to the experimentally obtained electron microscope tomography data according to an embodiment of the present disclosure.

In addition, in an embodiment of the present disclosure in FIGS. 11 and 12, the deep learning filter was applied to experimentally determine the three-dimensional surface atomic structure of the Pt nanoparticles. The experiment was performed using an aberration-corrected scanning transmission electron microscope (STEM), operated in an annular dark-field (ADF) mode. The tilt series of 21 images were obtained from Pt nanoparticles having a diameter of 4 nm from the tilt angles ranging from −71.6° to +71.6°. After imaging post-processing, the three-dimensional tomography photograph was reconstructed from the tilt series using the GENFIRE algorithm.

FIG. 11 is a three-dimensional image illustrating before and after deep learning of three-dimensional tomogram reconstructing an electron microscope tilt series acquired by experiment according to an embodiment of the present disclosure. FIG. 11 illustrates the raw three-dimensional reconstruction of nanoparticles before applying the deep learning filter. Atom-tracing and classification processes were applied to the volume, and as a result, a three-dimensional atomic model of 1,411 Pt atoms was generated. In the photographs of FIG. 11A and the corresponding column of FIG. 11C, the missing wedge problem and serious defects due to noise were clearly seen. The three-dimensional reconstruction of the atomic level structure suffers from elongation around the surfaces, in particular, in the direction of the missing wedge and undesired strength reduction. Even if many of those atoms are accurately found at F.C.C. lattice sites, some of the atoms may be clearly misrecognized and the surface atoms may be inappropriately defined. In order to determine the exact atomic structure including such a surface, the deep learning filter according to the embodiment of the present disclosure was applied to the measured tomography data. FIG. 11D clearly shows that the atomic intensities in the filtered output are properly isolated with the expected Gaussian shape. Referring to FIG. 11C, the atomic tracing on the deep learning filtered volume found 1,530 atoms, and about 100 more atoms were successfully identified.

FIG. 12 is an electron microscope photograph and a projection diagram illustrating an effect of applying the deep learning filter to the experimentally obtained electron microscope tomography data according to an embodiment of the present disclosure.

Referring to FIGS. 11D and 12, it can be seen that some of the lost atoms around the core region are recovered by the deep learning filtering. In particular, the surface boundaries according to the missing wedge direction were clearly defined after the deep learning filtering, which brings the effect of clearly determining the three-dimensional surface atomic structure without a masking process dependent on parameters, thereby enabling highly reliable determination of the atomic level structure of the three-dimensional surface of nanomaterials with a relatively simple process.

The embodiments described above may be implemented as a hardware component, a software component, and/or a combination of the hardware component and the software component. For example, the systems, the apparatuses, the methods, and the components described in the embodiments may be implemented using one or more general purpose computers or special purpose computers such as a processor, a controller, a central processing unit (CPU), a graphic processing unit (GPU), an arithmetic logic unit (AUL), a digital signal processor, a microcomputer, a field programmable gate array (FPGA), a programmable logic unit (PLU), a microprocessor, application specific integrated circuits (ASICS), a server, or any other devices that may execute instructions and respond to the instructions.

The data generating method according to the embodiment of the present disclosure may be implemented in a form of program commands that may be executed through various computer means and may be recorded in a computer-readable recording medium. The computer-readable recording medium may include a program command, a data file, a data structure, or the like, alone or in a combination thereof. The program commands recorded in the computer-readable recording medium may be specially designed and configured for the embodiments or be known to those skilled in a field of computer software. The abovementioned hardware device may be constituted to be operated as one or more software modules to perform the operations of the embodiments, and vice versa.

As described above, although the embodiments have been described by the limited drawings, various modifications and alternations are possible by those of ordinary skill in the art from the above description. For example, even though the described techniques may be performed in a different order than the described method, and/or components of the described systems, structures, devices, circuits, etc. may be coupled or combined in a different manner than the described method, or replaced or substituted by other components or equivalents, appropriate results can be achieved.

According to the present disclosure, the atomic model applicable to various nanomaterial structures is generated based on the atomicity as a scientific logic that has been well proven in the past, and data for the three-dimensional atomic structure at the individual atomic scale of a nanomaterial is amplified and generated using such a highly reliable atomic model, so it is possible to generate a large amount of highly reliable three-dimensional atomic structure data for learning through a relatively simple data amplification process.

According to the present disclosure, it is possible to provide an apparatus for determining a three-dimensional atomic structure and a method for determining the same with improved accuracy and reliability in identifying or determining a three-dimensional surface atomic structure of nanomaterials by training the deep learning filter with a large amount of three-dimensional atomic structure data for learning for the three-dimensional surface atomic structure of the individual atomic scale generated using the highly reliable atomic model, and generating and correcting, by the deep learning filter, data for areas where it is difficult to acquire data in the atomic-scale electron microscope due to the geometric measurement limiting factors (missing wedge defects, etc.) or various atomic level defects, strain, and the like.

The effect of the present disclosure is not limited to the above effects, and should be understood to include all effects that can be inferred from the detailed description of the present disclosure or the composition of the invention described in the claims.

It is to be understood that the scope of the present disclosure will be defined by the claims rather than the above-mentioned description and all modifications and alternations derived from the claims and their equivalents are included in the scope of the present disclosure.

What is claimed is:

1. A data generating apparatus, comprising:
an atomic model generator that generates one or more three-dimensional atomic models corresponding to a nanomaterial to be measured;
a three-dimensional data generator that generates three-dimensional atomic level structure volume data corresponding to the nanomaterial to be measured based on the one or more three-dimensional atomic model;
a tilt series generator that generates a tilt series by simulating three-dimensional tomography for a plurality of different angles in a predetermined angle range for at least some of the three-dimensional atomic level structure volume data; and
a three-dimensional atomic structure tomogram volume data generator that generates a three-dimensional atomic structure tomogram volume data set by performing three-dimensional reconstruction on at least some of the three-dimensional atomic level structure volume data based on the tilt series.

2. The data generating apparatus of claim 1, wherein the atomic model generator generates a three-dimensional atomic model based on a theoretical crystal structure of the nanomaterial to be measured and a three-dimensional atomic model based on an amorphous structure.

3. The data generating apparatus of claim 1, wherein the atomic model generator performs at least one of actualization correction processes including random atomic defect provision, random rotation or movement of the model structure, spatial change, atomic density change, and rand shape cropping on the one or more three-dimensional atomic models.

4. The data generating apparatus of claim 1, wherein the three-dimensional data generator generates the three-dimensional atomic level structure volume data by deriving a three-dimensional volume of atomic potential based on the one or more three-dimensional models and acquiring a result of convolution of a Gaussian distribution having the atomic potential and a predetermined standard deviation at each atomic position.

5. The data generating apparatus of claim 1, wherein the tilt series generator generates the tilt series by acquiring a linear projection from a three-dimensional atomic potential volume at a plurality of different tilt angles within the predetermined angle range for at least some of the three-dimensional atomic level structure volume data.

6. The data generating apparatus of claim 1, wherein the three-dimensional atomic structure tomogram volume data generator three-dimensionally reconstructs on the tilt series using a predetermined algorithm, and selects axis convention during the three-dimensional reconstruction so that at least one of an x-direction axis, a y-direction axis, and a z-direction axis is parallel to a missing wedge direction.

7. A data generating method, comprising:
an atomic model generating step of generating one or more three-dimensional atomic models corresponding to a nanomaterial to be measured;
a three-dimensional data generating step of generating three-dimensional atomic level structure volume data corresponding to the nanomaterial to be measured based on the one or more three-dimensional atomic model;
a tilt series generating step of generating a tilt series by simulating three-dimensional tomography for a plurality of different angles in a predetermined angle range for at least some of the three-dimensional atomic level structure volume data; and
a three-dimensional atomic structure tomogram volume data generating step of generating a three-dimensional atomic structure tomogram volume data set by performing three-dimensional reconstruction on at least some of the three-dimensional atomic level structure volume data based on the tilt series.

8. The data generating method of claim 7, wherein the atomic model generating step further includes generating a three-dimensional atomic model based on a theoretical crystal structure of the nanomaterial to be measured and a three-dimensional atomic model based on an amorphous structure.

9. The data generating method of claim 7, wherein the atomic model generating step further includes performing at least one of actualization correction processes including random atomic defect provision, random rotation or movement of the model structure, spatial change, atomic density change, and rand shape cropping on the one or more three-dimensional atomic models.

10. The data generating method of claim 7, wherein the three-dimensional data generating step further includes generating the three-dimensional atomic level structure volume data by deriving a three-dimensional volume of atomic potential based on the one or more three-dimensional models and acquiring a result of convolution of a Gaussian distribution having the atomic potential and a predetermined standard deviation at each atomic position.

11. The data generating method of claim 7, wherein the tilt series generating step further includes generating the tilt series by acquiring a linear projection from a three-dimensional atomic potential volume at a plurality of different tilt angles within the predetermined angle range for at least some of the three-dimensional atomic level structure volume data.

12. The data generating method of claim 7, wherein in the three-dimensional atomic structure tomogram volume data generating step, the three-dimensional reconstruction is performed on the tilt series using a predetermined algorithm, and an axis convention is selected during the three-dimensional reconstruction so that at least one of an x-direction axis, a y-direction axis, and a z-direction axis is parallel to a missing wedge direction.

13. An apparatus for determining a three-dimensional atomic level structure, comprising:
an atomic model generator that generates one or more three-dimensional atomic models corresponding to a nanomaterial to be measured;
a three-dimensional learning data generator that generates three-dimensional atomic structure tomogram volume data corresponding to the nanomaterial to be measured as three-dimensional learning data by simulating and reconstructing three-dimensional tomography based on the one or more three-dimensional atomic model;
a deep learning filter generator/learner that generates a deep learning filter by training a machine learning model using the three-dimensional learning data; and
a three-dimensional atomic level structure determiner that generates second three-dimensional atomic structure tomogram volume data, in which an atomic arrangement region with insufficient data is corrected, by filtering first three-dimensional atomic structure tomogram volume data acquired through electron microscopy measurement of the nanomaterial to be measured with the deep learning filter, and determines a three-dimensional atomic level nanostructure of the nanomaterial to be measured based on the second three-dimensional atomic structure tomogram volume data.

14. The apparatus of claim 13, wherein the three-dimensional learning data generator includes:
A three-dimensional data generator that generates three-dimensional atomic level structure volume data corresponding to the nanomaterial to be measured based on the one or more three-dimensional atomic model;
a tilt series generator that generates a tilt series by simulating three-dimensional tomography for a plurality of different angles in a predetermined angle range for at least some of the three-dimensional atomic level structure volume data; and
a three-dimensional atomic structure tomogram volume data generator that generates a three-dimensional atomic structure tomogram volume data set by performing three-dimensional reconstruction on at least some of the three-dimensional atomic level structure volume data based on the tilt series, and
the reconstructed three-dimensional atomic structure tomogram volume data set forms a three-dimensional learning data set for the training the deep learning filter.

15. The apparatus of claim 14, wherein the three-dimensional data generator generates the three-dimensional atomic level structure volume data by deriving a three-dimensional volume of atomic potential based on the one or more three-dimensional models and acquiring a result of convolution of a Gaussian distribution having the atomic potential and a predetermined standard deviation at each atomic position.

16. The apparatus of claim 15, wherein the three-dimensional data generator generates, as a three-dimensional target data set, three-dimensional atomic level structure volume data acquired by deriving the three-dimensional volume of the atomic potential based on the one or more three-dimensional models and positioning a Gaussian distribution having a standard deviation equal to or different from the predetermined standard deviation at each atomic position in the three-dimensional volume.

17. The apparatus of claim 16, wherein the deep learning filter generator/learner calculates an error by comparing a result output from the deep learning filter through forward-propagation based on the three-dimensional learning input data set with the three-dimensional target data set, updates hyperparameters of the deep learning filter in a manner, in which the error is reduced, by calculating a gradient of the error in a reverse direction from an output layer to an input layer based on the error, and trains the deep learning filter and optimizes the parameters of the filter to determine the three-dimensional atomic level structure, by repeating the process.

18. A method for determining a three-dimensional atomic level structure, the method comprising:
- an atomic model generating step of generating one or more three-dimensional atomic models corresponding to a nanomaterial to be measured;
- a three-dimensional learning data generating step of generating three-dimensional atomic level structure volume data corresponding to the nanomaterial to be measured as three-dimensional learning data by simulating and reconstructing three-dimensional tomography based on the one or more three-dimensional atomic model;
- a deep learning filter generating/learning step of generating a deep learning filter by training a machine learning model using the three-dimensional learning data; and
- a three-dimensional atomic level structure determining step of generating second three-dimensional atomic structure tomogram volume data, in which an atomic arrangement region with insufficient data is corrected, by filtering first three-dimensional atomic structure tomogram volume data acquired through electron microscopy measurement of the nanomaterial to be measured with the deep learning filter, and determining a three-dimensional atomic level nanostructure of the nanomaterial to be measured based on the second three-dimensional atomic structure tomogram volume data.

19. The method of claim 18, wherein the three-dimensional learning data generating step includes:
- a three-dimensional data generating step of generating three-dimensional atomic level structure volume data corresponding to the nanomaterial to be measured based on the one or more three-dimensional atomic model;
- a tilt series generating step of generating a tilt series by simulating three-dimensional tomography for a plurality of different angles in a predetermined angle range for at least some of the three-dimensional atomic level structure volume data; and
- a three-dimensional atomic structure tomogram volume data generating step of generating a three-dimensional atomic structure tomogram volume data set by performing three-dimensional reconstruction on at least some of the three-dimensional atomic level structure volume data based on the tilt series, and
- the reconstructed three-dimensional atomic structure tomogram volume data set forms a three-dimensional learning data set for the training the deep learning filter.

20. The method of claim 19, wherein the three-dimensional data generating step further includes generating the three-dimensional atomic level structure volume data by deriving a three-dimensional volume of atomic potential based on the one or more three-dimensional models and acquiring a result of convolution of a Gaussian distribution having the atomic potential and a predetermined standard deviation at each atomic position.

21. The method of claim 20, wherein the three-dimensional data generating step further includes generating, as a three-dimensional target data set, three-dimensional atomic level structure volume data acquired by deriving the three-dimensional volume of the atomic potential based on the one or more three-dimensional models and positioning a Gaussian distribution having a standard deviation equal to or different from the predetermined standard deviation at each atomic position in the three-dimensional volume.

22. The method of claim 21, wherein the deep learning filter generation/learning step further includes a step of optimizing parameters of the deep learning filter to determine a three-dimensional atomic level structure, and
the optimizing step includes:
- calculating an error by comparing the result output from the deep learning filter through forward-propagation based on the three-dimensional learning input data set with the three-dimensional target data set;
- updating hyperparameters of the deep learning filter in a manner, in which the error is reduced, by calculating (back-propagation) a gradient of the error in a reverse direction (from an output layer to an input layer) based on the error; and
- training the deep learning filter and optimizing the parameters of the filter to determine the three-dimensional atomic level structure, by repeating the process.

* * * * *